US006698851B1

United States Patent
Ludl (10) Patent No.: US 6,698,851 B1
(45) Date of Patent: Mar. 2, 2004

(54) VERTICALLY STACKED CONTROL UNIT

(75) Inventor: Helmut Ludl, Pound Ridge, NY (US)

(73) Assignee: Ludl Electronic Products, Ltd., Hawthorne, NY (US)

( * ) Notice: Subject to any disclaimer, the term of this patent is extended or adjusted under 35 U.S.C. 154(b) by 74 days.

(21) Appl. No.: 09/927,229

(22) Filed: Aug. 10, 2001

(51) Int. Cl.[7] .............................................. A47B 87/00
(52) U.S. Cl. ........................ 312/108; 312/111; 361/685
(58) Field of Search ............................... 312/108, 111, 312/223.1, 223.2; 361/683, 685, 724, 725, 726, 727, 728, 729, 732, 735; 206/504, 509, 512; 403/335, 345, 359.1, 380

(56) References Cited

U.S. PATENT DOCUMENTS

| | | | | |
|---|---|---|---|---|
| 4,558,914 A | * | 12/1985 | Prager et al. ................ | 361/729 |
| D318,874 S | | 8/1991 | Pushelberg et al. | |
| D320,979 S | | 10/1991 | Vice et al. | |
| 5,131,272 A | * | 7/1992 | Minei et al. ................. | 361/685 |
| 5,142,445 A | * | 8/1992 | Sorensen et al. ............ | 361/726 |
| D338,874 S | | 8/1993 | Renard | |
| 5,251,106 A | * | 10/1993 | Hui ............................. | 361/744 |
| D353,143 S | | 12/1994 | Namba | |
| D355,419 S | | 2/1995 | Namba | |
| 5,519,572 A | * | 5/1996 | Luo ............................. | 361/685 |
| 5,544,969 A | * | 8/1996 | Ammon et al. .............. | 361/744 |
| 5,602,721 A | | 2/1997 | Slade et al. | |
| D381,337 S | | 7/1997 | Fechner et al. | |
| 5,645,434 A | * | 7/1997 | Leung ......................... | 361/735 |
| D393,251 S | | 4/1998 | Kurokawa | |
| 5,838,548 A | | 11/1998 | Matz et al. | |
| 5,913,926 A | * | 6/1999 | Anderson et al. ........... | 361/685 |
| 6,038,126 A | | 3/2000 | Weng | |
| 6,327,152 B1 | * | 12/2001 | Saye ........................... | 361/735 |
| 6,431,879 B2 | * | 8/2002 | Brekosky et al. ........... | 361/804 |
| 2002/0125799 A1 | * | 9/2002 | Landsberger et al. ....... | 312/108 |
| 2003/0007321 A1 | * | 1/2003 | Dayley ........................ | 361/683 |

FOREIGN PATENT DOCUMENTS

| | | | | |
|---|---|---|---|---|
| FR | 2695531 | * | 3/1994 | ................. 361/728 |
| JP | 04157798 | * | 5/1992 | ................. 361/716 |

* cited by examiner

*Primary Examiner*—Lanna Mai
*Assistant Examiner*—Hanh V. Tran
(74) *Attorney, Agent, or Firm*—Collard & Roe, P.C.

(57) ABSTRACT

A control system (10) is built with functional modules expandable system, usually containing electronic circuit boards (24). The packaging of the modules allow a variable number of modules to be vertically stacked together to form a variably sized control system. There is a module having a housing which engages the housing of an abutting module in a physically locked relationship, based upon four locking elements. There are modular units (16, 18, 20) which can be joined vertically by having two interlocking control units in the front of each module and two interlocking control units in the back of each module. Placed above the uppermost intermediate module is a top module (12) for the control unit. Placed below the lowermost intermediate module is a bottom module (14) for the control unit.

17 Claims, 7 Drawing Sheets

VERTICALLY STACKED CONTROL UNIT

BACKGROUND OF THE INVENTION

1. Field of the Invention

The present invention relates generally to control systems; and more particularly the invention relates to a control system built with functional modules which can be vertically stacked together to form an expandable system, usually containing electronic circuit boards.

The present invention is directed to a modular control system and particularly to the packaging of the modules which allows a variable number of modules to be vertically stacked together and form a variably sized electronic control system.

2. The Prior Art

Modular network apparatus is known from the following patents:

| U.S. Pat. No. | Patentee | Issue Date |
| --- | --- | --- |
| Des. 318,874 | Pushelberg et al | Aug. 6, 1991 |
| Des. 320,979 | Vice et al | Oct. 22, 1991 |
| Des. 338,874 | Renard | Aug. 31, 1993 |
| Des. 353,143 | Namba | Dec. 6, 1994 |
| Des. 355,419 | Namba | Feb. 14, 1995 |
| Des. 381,337 | Fechner et al | Jul. 22, 1997 |
| Des. 393,251 | Kurokawa | Apr. 7, 1998 |
| 5,602,721 | Slade et al | Feb. 11, 1997 |
| 5,838,548 | Matz et al | Nov. 17, 1998 |
| 6,038,126 | Weng | Mar. 14, 2000 |

The disclosure of each of the above patents is herewith incorporated by reference.

The Slade U.S. Pat. No. 5,602,721 discloses that modular units can be joined as follows. There is a rail 36 which slidably engages a recess in the bottom surface of an abutting module.

The rail comprises two generally raised triangular portions and with the long sides of the two triangular portions slidably engaging each other to form a generally rectangular rail. A screw 52 extends through the portion 50 and threadably engages the second triangular portion 51 whereby rotation of screw slides triangular portion 51 relative to triangular portion 50 to change the width of the generally rectangular rail for locking and unlocking in a mating recess on the bottom side of an abutting module.

The bottom side of the module 28 shows the fans in the front surface 30. The bottom side has a complimentary configuration relation to the top side for stacking of the modules. A first surface 54 of the bottom side includes a dovetailed recess 56 which mates with the rail 36 shown on the top side.

SUMMARY OF THE INVENTION

It is an object of the present invention to provide a modular controller system which is readily vertically expandable. A feature of the invention is a module having a housing which engages the housing of an abutting module in a physically locked relationship, based upon four locking elements.

It is a further object of the present invention to provide modular units which can be joined vertically by having two interlocking connector units in the front of each module and two interlocking connector units in the back of each module.

The present invention is directed to a vertically stacked control unit which includes an expandable plurality of functional modules. These modules are vertically stacked one above the other. Placed above the uppermost intermediate module is a top module for the control unit. Placed below the lowermost intermediate module is a bottom module for the control unit.

More particularly, the present invention relates to a vertically stacked control unit comprising an expandable plurality of functional modules, such as intermediate modules, with each module having a front side, a back side, a top side, a bottom side, a right side, and a left side;

said top side of said module having a first skirt receptacle on the right side and having a second skirt receptacle on the left side;

said bottom side of said module having a first skirt on the right side and having a second skirt on the left side;

said front side of each module having a top edge and a bottom edge; said back side of each module having a top edge and a bottom edge; said front side top edge having a first U-shaped receiver on the right side and having a second U-shaped receiver on the left side; said front side bottom edge having a first pin on the right side and having a second pin on the left side;

said back side top edge having a first groove on the right side and having a second groove on the left side;

said back side bottom edge having a first tongue on the right side and having a second tongue on the left side; and whereby a plurality of functional modules can be vertically stacked together with a first skirt and a second skirt of an upper module engaging a first and a second skirt receptacle respectively of a vertically adjoining lower module; with said first tongue and said second tongue of said upper module engaging said first groove and said second groove respectively of said vertically adjoining lower module; and with said first pin and said second pin on said upper module fitted respectively within said first U-shaped receiver and said second U-shaped receiver of said vertically adjoining lower module. This technique for interconnecting modules is applicable for connecting together intermediate modules; or for connecting together a top module to an intermediate module; or for connecting together a bottom module to an intermediate module.

The first U-shaped receiver on the right side is adjacent to the first skirt receptacle on the right side. The second U-shaped receiver on the left side is adjacent to the second skirt receptacle on the left side.

The first pin on the right side is attached to the first skirt on the right side. The second pin on the left side is attached to the second skirt on the left side. The first pin on the right side can also be attached to an extension of the first skirt on the right side. The second pin on the left side can also be attached to an extension of the second skirt on the left side.

The back side top edge first groove on the right side is adjacent to the first skirt receptacle on the right side. The back side top edge second groove on the left side is adjacent to the second skirt receptacle on the left side.

A first inwardly directed shoulder on the right side connects said first groove on the right side to said first skirt receptacle on the right side. A second inwardly directed shoulder on the left side connects said second groove on the left side to said second skirt receptacle on the left side.

The back side bottom edge first tongue on the tight side is adjacent to the first skirt on the right side. The back side bottom edge second tongue on the left side is adjacent to the second skirt on the left side.

The bottom module is shaped preferably like a hollow cube or a hollow parallelepiped. The bottom module has five walls, namely a front side wall, a back side wall, a right side wall, a left side wall, all joined to a bottom wall. There is no top wall and the interior is hollow. Electronic components may be placed within this hollow interior.

The bottom module of the control unit only has on the front side a top edge, and not a bottom edge on the front side. The front side top edge has a first U-shaped receiver on the right side and has a second U-shaped receiver on the left side.

The bottom module of the control unit only has on the back side a top edge, and not a bottom edge on the back side. The back side top edge has a first groove on the right side and has a second groove on the left side.

The top module is preferably shaped as a solid flat self-supporting metal sheet having a front side, a back side, a right side, and a left side, all joined to a top side.

The top module of the control unit only has on the front side a bottom edge, and not a top edge on the front side. The front side bottom edge has a first pin on the right side and has a second pin on the left side.

The top module of the control unit only has on the back side a bottom edge, and not a top edge on the back side. The back side bottom edge has a first tongue on the right side and has a second tongue on the left side.

Also, the present invention is directed to a vertically stacked control unit comprising
- a top module of the control unit only having on a front side a bottom edge, and not a top edge on the front side; said front side bottom edge having a first pin on a right side and having a second pin on a left side;
- said top module of the control unit only having on the back side a bottom edge, and not a top edge on the back side; said back side bottom edge having a first tongue on a right side and having a second tongue on a left side; said first tongue adjacent to a first skirt-on the right side; and said second tongue adjacent to a second skirt on the left side;
- a bottom module of the control unit only having on a front side a top edge, and not a bottom edge on the front side; said front side top edge having a first U-shaped receiver on a right side and having a second U-shaped receiver on a left side;
- said bottom module of the control unit only having on a back side a top edge, and not a bottom edge on the back side; said back side top edge having a first groove on a right side and having a second groove on a left side; and
- said bottom module having a first skirt receptacle on the right side and having a second skirt receptacle on the left side; and
- whereby the top and bottom functional modules can be vertically stacked together with a first skirt and a second skirt of the top engaging a first and a second skirt receptacle respectively of a vertically adjoining bottom module; with said first tongue and said second tongue of said top module engaging said first groove and said second groove respectively of said vertically adjoining bottom module; and with said first pin and said second pin on said top module fitted respectively within said first U-shaped receiver and said second U-shaped receiver of said vertically adjoining bottom module.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawings, wherein similar reference characters denote similar elements throughout the figures.

DETAILED DESCRIPTION OF PREFERRED EMBODIMENTS

Figure 1:
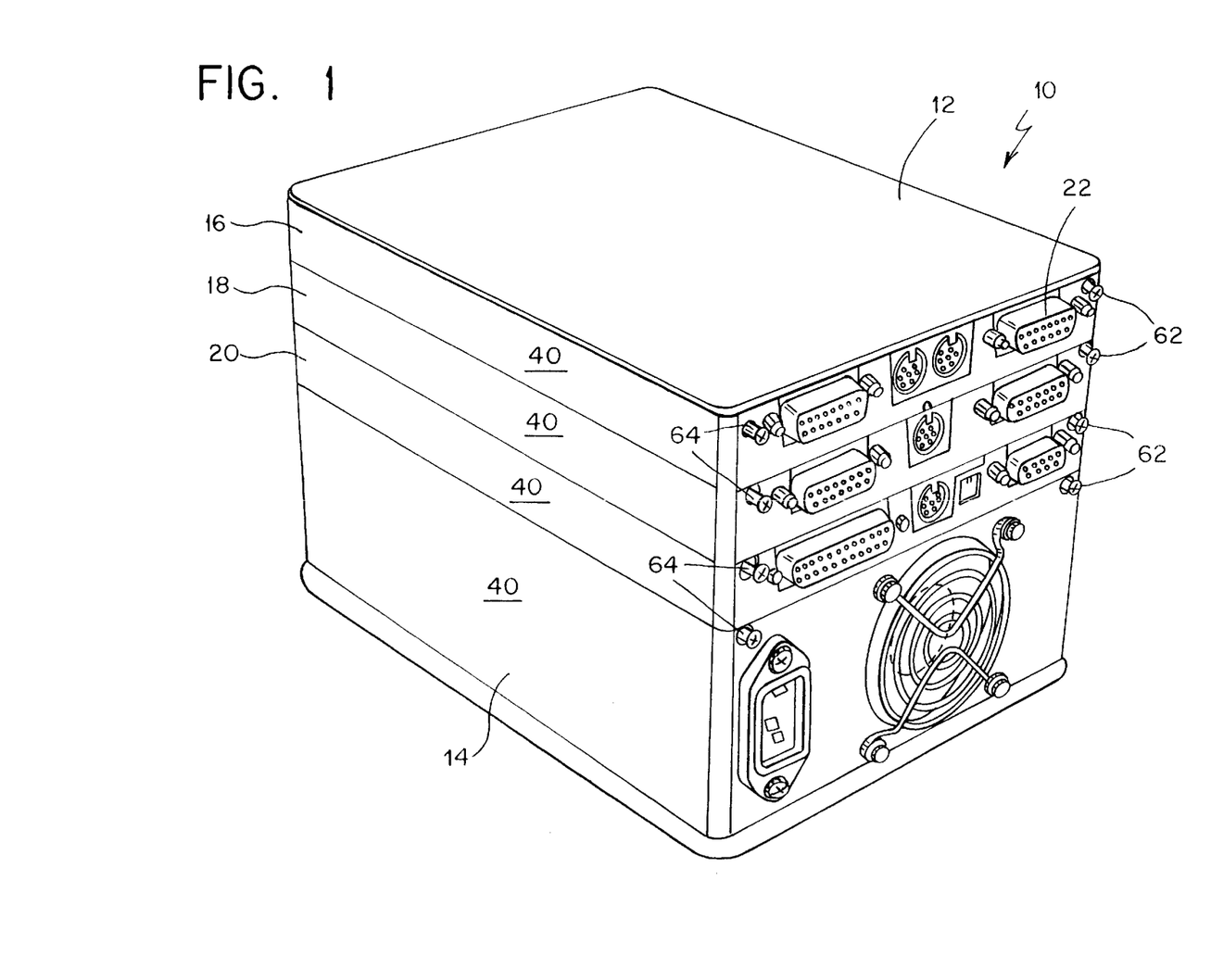
FIG. 1 shows a perspective view of the fully assembled vertically stacked control unit of the invention.

Turning now in detail to the drawings FIG. 1 shows a front perspective view of the fully assembled vertically stacked controller unit 10 of the invention. Control unit 10 is made of a top module 12, and a bottom module 14, with several intermediate modules 16, 18 and 20 position vertically arranged between the top module 12 and the bottom module 14.

The various electrical connector plugs on the front of the control unit as shown as plug 22 are illustrative of connectors which attach to internal circuit boards. These plugs are not a part of the invention. The control unit 10 and all of the modules are preferably made of metal such as stainless steel, aluminum, brass, bronze, or copper and do not rust. Also, they can be made of plastic or ceramic material.

Figure 2:
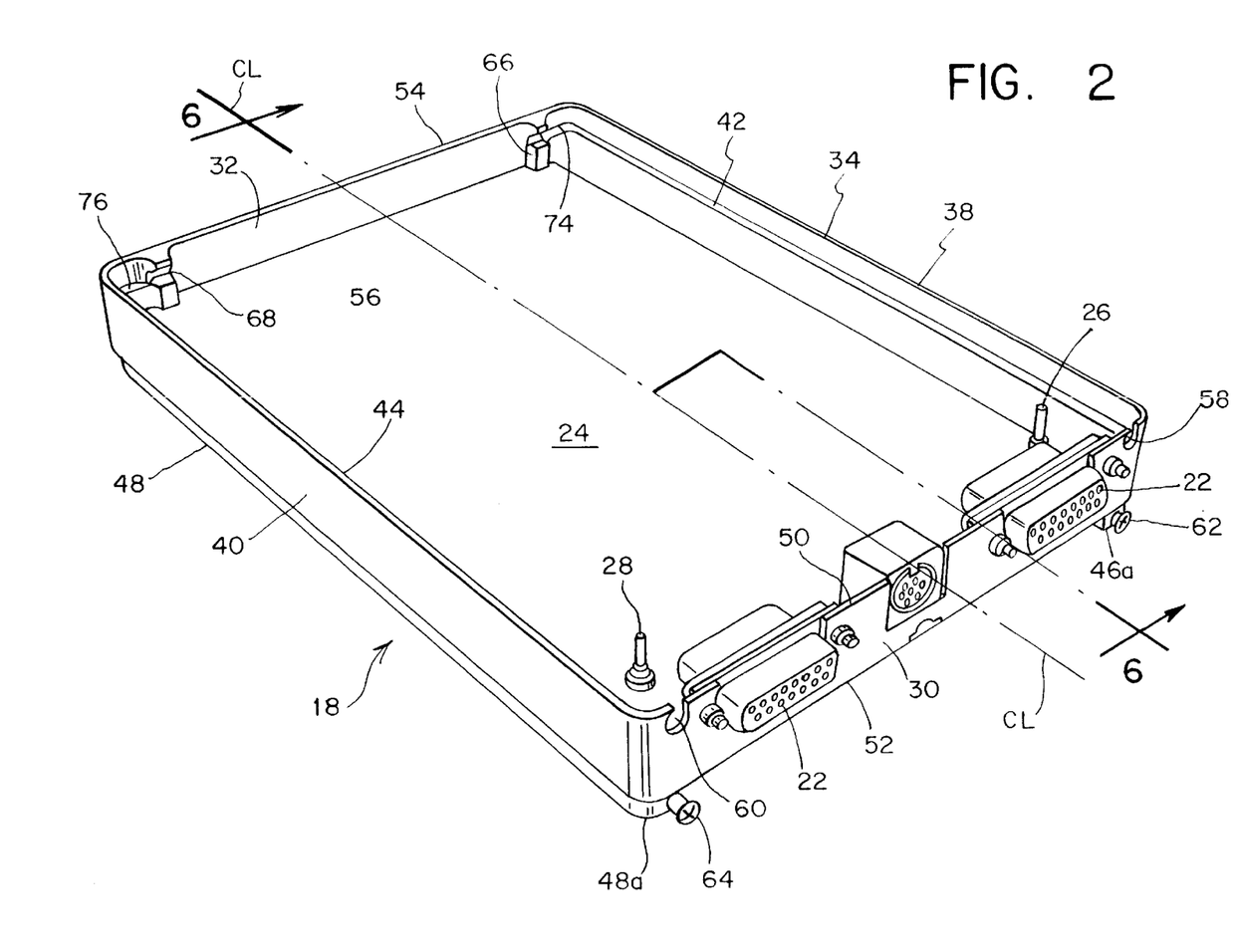
FIG. 2 show a top perspective front view of an intermediate module of the invention.
Figure 3:
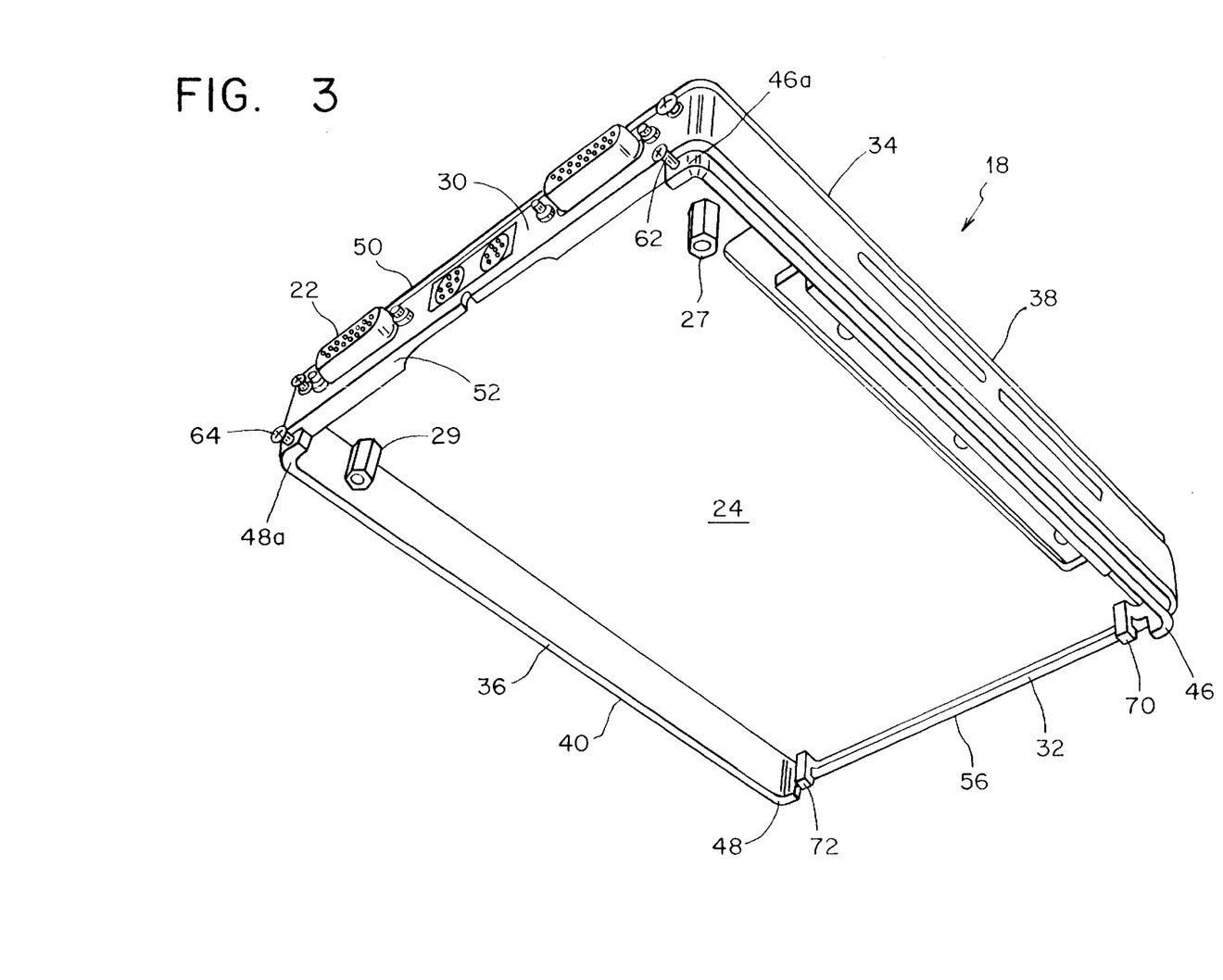
FIG. 3 shows a bottom perspective front view of the intermediate module of FIG. 2.

FIG. 2 shows a top perspective front view of an intermediate module, such as 16, 18 or 20 of the invention. Placed within the module 18 is a circuit board 24 for which the electronic circuit elements are not shown, because these circuit elements are not a part of the present invention. However, auxiliary male connectors 26 and 28 are attached to the plastic circuit board. Auxiliary connectors 26 and 28 are preferably made of metal such as copper, aluminum, or magnesium and will not rust. Connectors 26 and 28 can be made also of plastic or ceramic material. FIG. 3 shows auxiliary female connector 27 and 29 which are attached to the circuit board 24. Connectors 27 and 29 are made of the same material as are connectors 26 and 28.

Connectors 26 and 27 are matingly engageable, while connectors 28 and 29 are matingly engageable. Connector 26 fits within connector 27, while connector 28 fits within connector 29.

As shown in FIGS. 2, 3, 4, 5 and 6, within the vertically stacked control unit 10 is an expandable plurality of intermediate functional modules, such as module 18. Module 18 has a front side 30, a back side 32, a top side 34, a bottom side 36, a right side 38, and a left side 40. For the sake of brevity, only module 18 is described, because module 18 is representative of all of the intermediate modules, such as 16, 18, or 20.

The top side 34 of the module has a first skirt receptacle 42 on the right side 38 and has a second skirt receptacle 44 on the left side 40.

As shown in FIGS. 2 and 3, the intermediate module 18 is made by interconnecting four walls 30, 32, 38 and 40 so as to form a continuous rectangular perimeter which is open at the top and open at the bottom. Circuit board 24 may be placed within the open space of the perimeter and attached to the intermediate module 18.

The bottom side 36 of the module has a first skirt 46 on the right side 3.8 and has a second skirt 48 on the left side 40.

The front side 30 of each module has a top edge 50 and a bottom edge 52.

Figures 4, 5, 6:
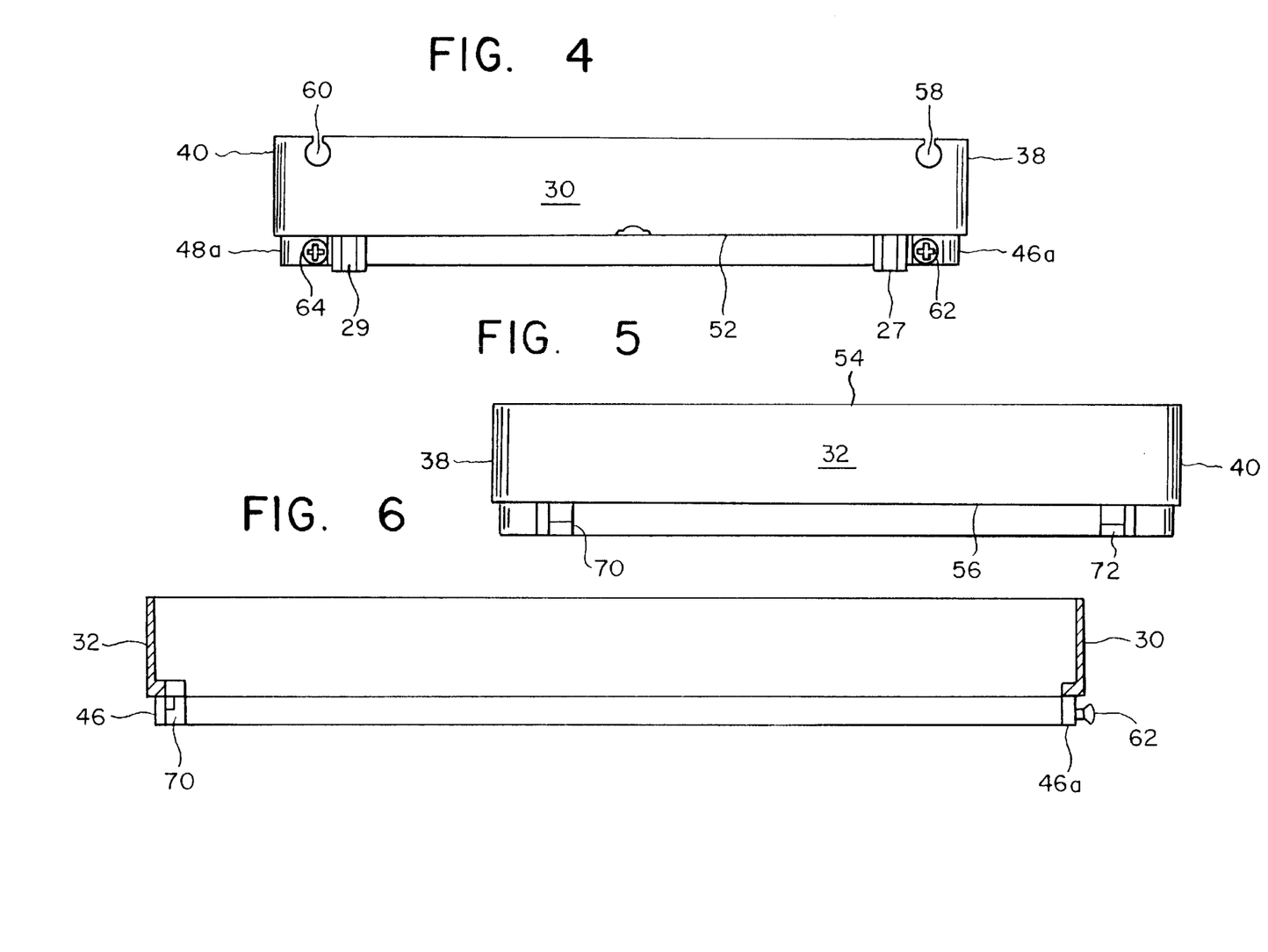
FIG. 4 shows a front view of the intermediate module of FIG. 2.
FIG. 5 shows a rear view of the intermediate module of FIG. 2.
FIG. 6 shows a section view of the intermediate module along line 6—6 of FIG. 2.
Figure 7:
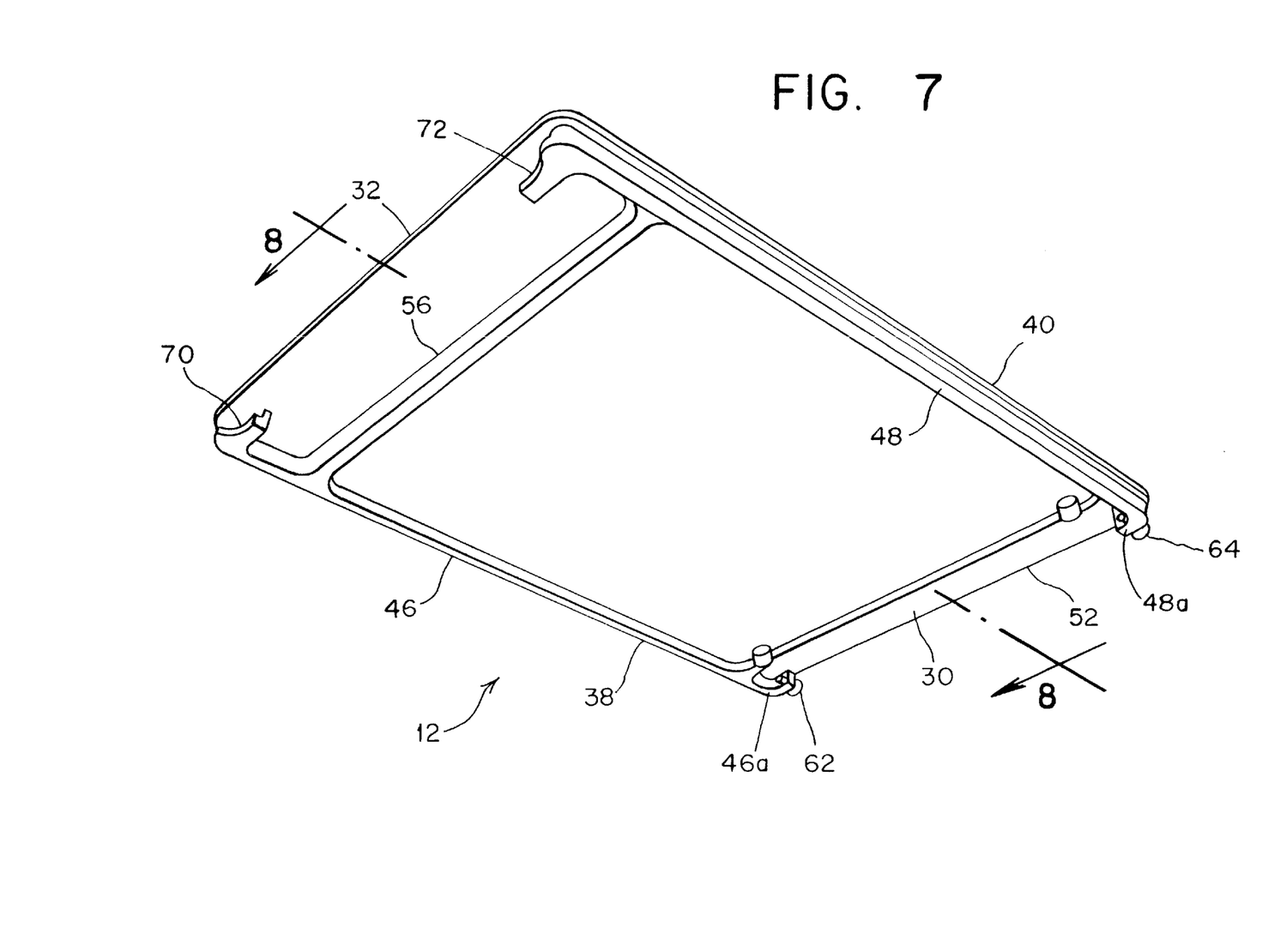
FIG. 7 shows a bottom perspective view of the top module of the invention.
Figure 8:
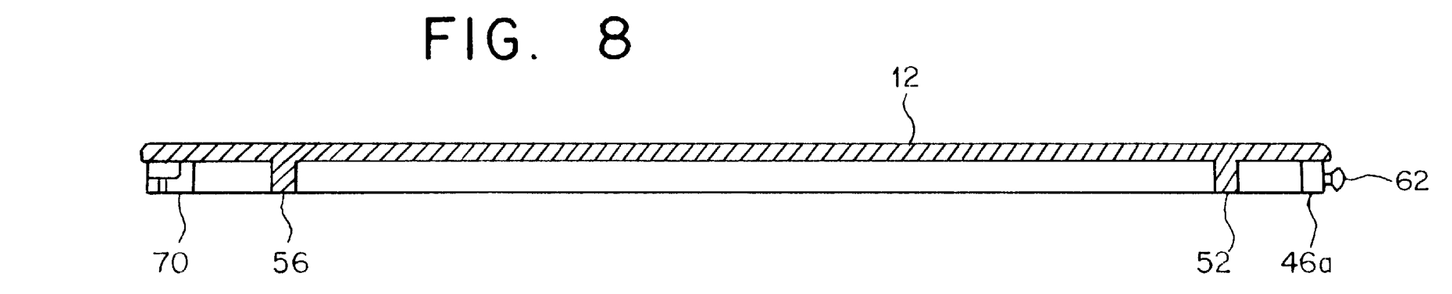
FIG. 8 shows a section view of the top module along line 8—8 of FIG. 7.
Figure 9:
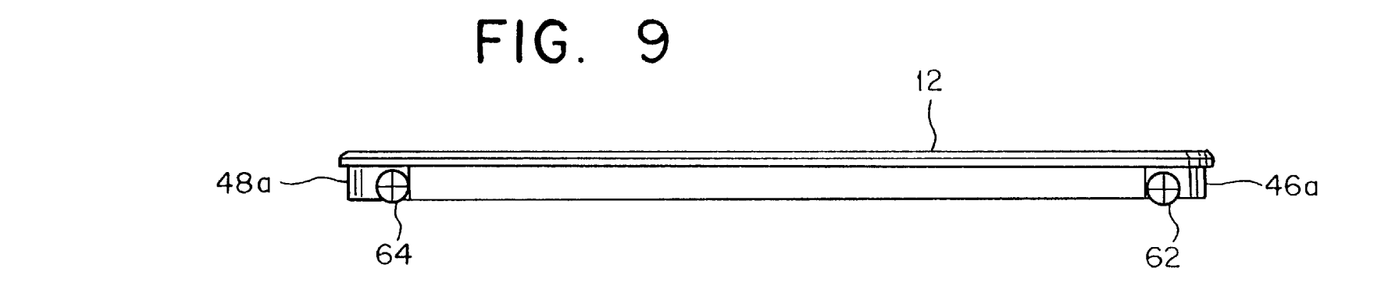
FIG. 9 shows a front view of the top module of FIG. 7.
Figure 10:
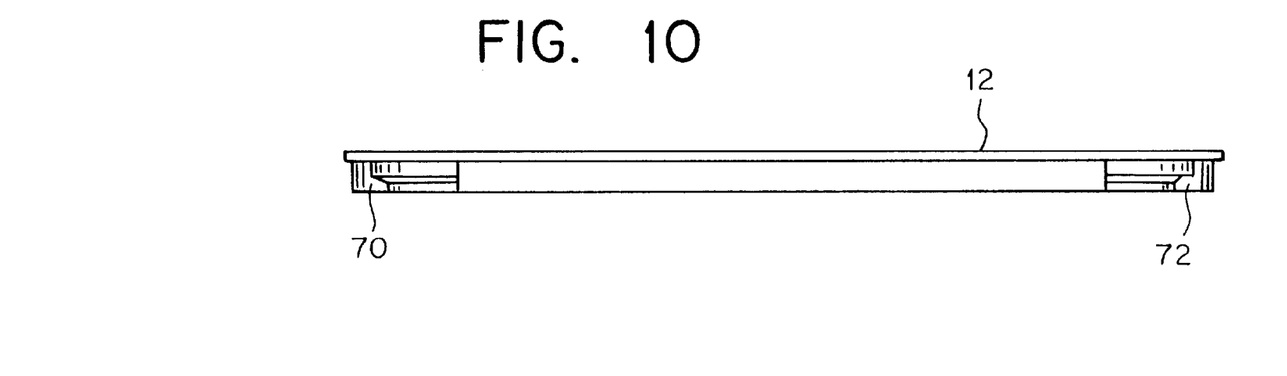
FIG. 10 shows a rear view of the top module of FIG. 7.

As show in FIG. 5, the back side 32 of each module has a top edge 54 and a bottom edge 56. As shown in FIG. 4, the front side top edge 50 has a first U-shaped receiver 58 on the right side 38 and has a second U-shaped receiver 60 on the left side 40. The front side bottom edge 52 has a first pin 62 on the right side 38 and has a second pin 64 on the left side 40. For simplicity sake, the connector plugs 22 are not shown in FIG. 4.

The back side top edge 54 as shown in FIG. 2 has a first groove 66 on the right side 38 and has a second groove 68 on the left side 40. As shown in FIG. 3, the back side bottom edge 56 has a first tongue 70 on the right side 38 and has a second tongue 72 on the left side 40.

Therefore a plurality of functional modules such as 12, 14, 16, 18 and 20 can be vertically stacked together and interconnected with a skirt 46 or 48 of an upper module 18 engaging a skirt receptacle 42 or 44 respectively of a vertically adjoining lower module 20. Also a first tongue 70 and the second tongue 72 of the upper module 18 will engage the first groove 66 and the second groove 68 respectively of said vertically adjoining lower module 20. Then the first pin 62 and the second pin 64 on the upper module 18 are fitted respectively within the first U-shaped receiver 58 and the second U-shaped receiver 60 of the vertically adjoining lower module 20.

The first U-shaped receiver 58 on the right side 38 is adjacent to the first skirt receptacle 42 on the right side 38. The second U-shaped receiver 60 on the left side 40 is adjacent to the second skirt receptacle 44 on the left side 40.

The first pin 62 on the right side 38 is attached to the first skirt 46 on the right side 38. The second pin 64 on the left side 40 is attached to the second skirt 48 on the left side 40.

The first pin 62 on the right side is preferably attached to an extension 46a of the first skirt 46 on the right side 38. The second pin 64 on the left side 40 is preferably attached to an extension 46a of the second skirt 48 on the left side 40. Extension 46a and Extension 48a extend inwardly toward the center line CL.

The back side top edge first groove 66 on the right side 38 is adjacent to the first skirt receptacle 42 on the right side 38. The back side top edge second groove 68 on the left side 40 is adjacent to the second skirt receptacle 44 on the left side 40.

As shown in FIG. 2, a first inwardly directed shoulder 74 on the right side 38 connects the first groove 66 on the right side 38 to the first skirt receptacle 42 on the right side 38. A second inwardly directed shoulder 76 on the left side 40 connects the second groove 68 on the left side 40 to the second skirt receptacle 44 on the left side 40. Shoulders 74 and 76 are inwardly directed toward center line CL.

The back side bottom edge first tongue 70 on the right side 38 is adjacent to the first skirt 46 on the right side 38. The back side bottom edge second tongue 72 on the left side 40 is adjacent to the second skirt 48 on the left side 40.

FIGS. 7, 8, 9 and 10 show the top module 12 which closes and seals the upper portion of controller unit 10. The top module 12 only has on the front side 30 a bottom edge 52, and not a top edge on the front side. The front side bottom edge 52 has a first pin 62 on the right side 38 attached to skirt 46 and has a second pin 64 on the left side 40 attached to skirt 48.

The top module 12 only has on the back side 32 a bottom edge 56, and not a top edge on the back side. The back side bottom edge 56 has a first tongue 70 on the right side 38 and has a second tongue 72 on the left side 40. The top module has a first tongue 70 on the right side 38 adjacent to the first skirt 46 on the right side 38. The top module has a second tongue 72 on the left side 40 adjacent to the second skirt 48 on the left side 40.

Figure 11:
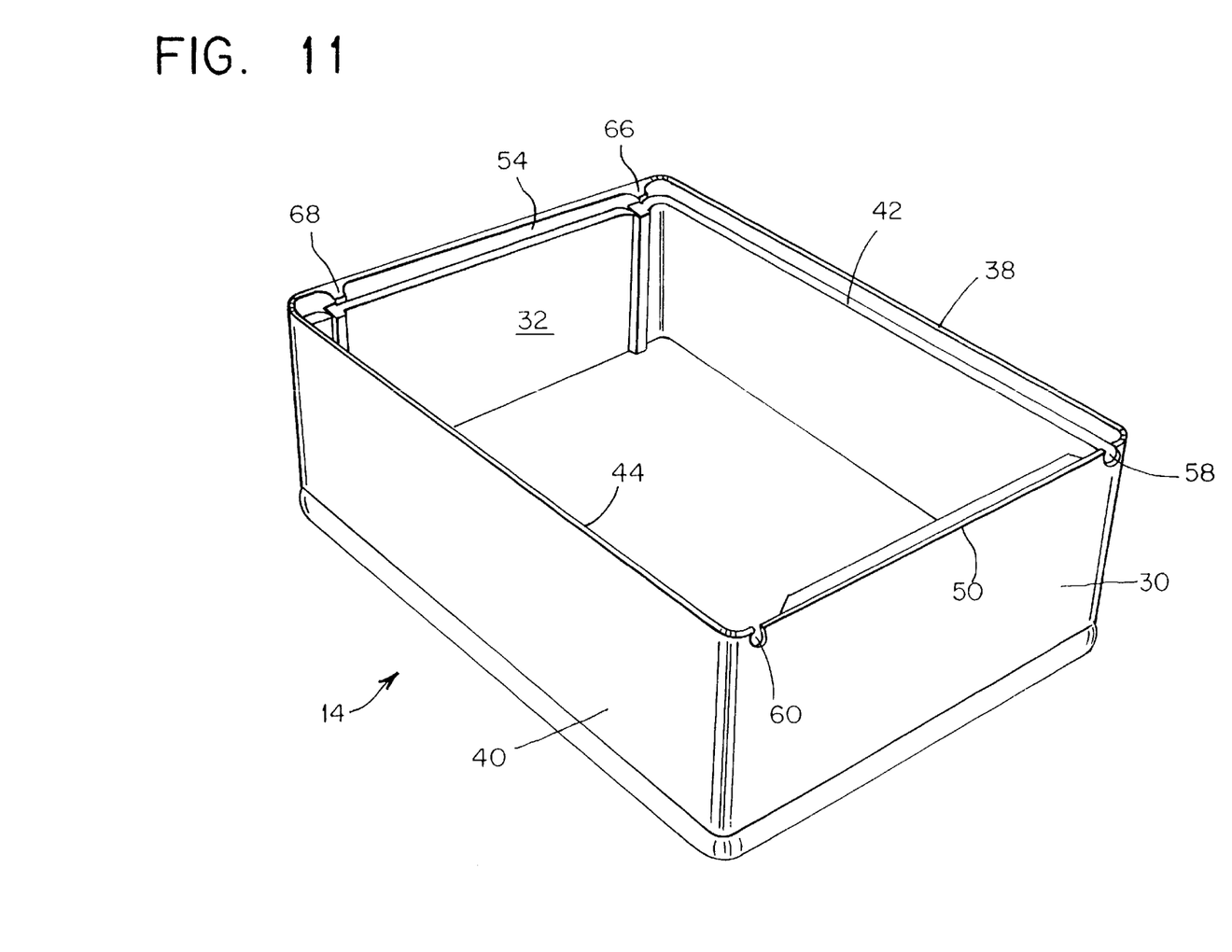
FIG. 11 shows atop front perspective view of the bottom module of the invention.

FIG. 11 show the bottom module 14 of the controller unit. The bottom module of the control unit only has on the front side 30 a top edge 50, and not a bottom edge on the front side 30. The front side top edge 50 has a first U-shaped receiver 58 on the right side 38 and has a second U-shaped receiver 60 on the left side 40. The bottom module has a first skirt receptacle 42 on the right side 38, and has a second skirt receptacle 44 on the left side 40.

The bottom module of the control unit only has on the back side 32, a top edge 54, and not a bottom edge on the back side 32. The back side top edge 54 has a first groove 66 on the right side 38 and has a second groove 68 on the left side 40. The pins 62 and 64 can be movable nails which are removably placed into position. It is also possible for pins 62 and 64 to be adjustable screw threaded fasteners which can be made to advance outwardly away from front side 30 or can be made to retreat inwardly into the front side 30 of each module 12, 16, 18, 20, or 14. This movement of the pins 62 and 64 can occur after the controller unit has been assembled so that the pins are within the U-shaped receiver 58 or 60 in order to seal the controller. When the pins 62 and 64 are tightened within the receivers 58 or 60, the controller unit is sealed, and the modules are immovable within the stack. When the pins 62 and 64 are sufficiently outwardly, the modules can be removed or rearranged in position or new modules vertically added.

The two grooves 66 and 68 on the back side of each module can be C-shaped or can be a modified C-shape, namely <-shaped. Interconnecting with each of the two grooves 66 and 68 are the two tongues 70 and 72. As shown in FIG. 6, each tongue is seen to be shaped as the lower part of the shape of a reverse C, namely ]-shaped, which is bracket shaped.

Because of the universal connectability of the various modules, whether top module 12, or bottom module 14, or intermediate modules 16, 18 and 20, these modules may be connected together in various orders. For example, the top module 12 may be connected directly to the bottom module 14. In another embodiment the top module 12 may be connected to a first intermediate module 16, and/or to a second intermediate module 18, and/or to a third intermediate module 20. Then either the first intermediate module 16 is connected to the bottom module 14, or the second intermediate module 18 is connected to the bottom module 14, or the third intermediate module 20 is connected to the bottom module 14. Thus, the top module may be connected to a first intermediate module which is then connected to the bottom module. In another embodiment, the top module may be connected to a first intermediate module which is then connected to one or several other intermediate modules, the bottom of which is connected to the bottom module.

For example, the top and bottom functional modules can be vertically stacked together with a first skirt and a second skirt of the top engaging a first and a second skirt receptacle respectively of a vertically adjoining bottom module; with said first tongue and said second tongue of said top module engaging said first groove and said second groove respectively of said vertically adjoining bottom module; and with said first pin and said second pin on said top module fitted respectively within said first U-shaped receiver and said second U-shaped receiver of said vertically adjoining bottom module.

In addition the top and an intermediate functional modules can be vertically stacked together with a first skirt and a second skirt of the top engaging a first and a second skirt receptacle respectively of a vertically adjoining lower intermediate module; with said first tongue and said second tongue of said top module engaging said first groove and said second groove respectively of said vertically adjoining lower intermediate module; and with said first pin and said second pin on said top module fitted respectively within said first U-shaped receiver and said second U-shaped receiver of said vertically adjoining lower intermediate module.

Moreover an intermediate and bottom functional modules can be vertically stacked together with a first skirt and a second skirt of the upper intermediate engaging a first and a second skirt receptacle respectively of a vertically adjoining bottom module; with said first tongue and said second tongue of said upper intermediate module engaging said first groove and said ,second groove respectively of said vertically adjoining bottom module; and with said first pin and said second pin on said upper intermediate module fitted respectively within said first U-shaped receiver and said second U-shaped receiver of said vertically adjoining bottom module.

The top, intermediate, and bottom module, if made of metal, can each be manufactured by any of the following known metal processing techniques such as casting, stamping, welding, and/or machining.

The vertically stacked control unit 10 can be used to control an automated device, apparatus or instrument such as that described in a U.S. Patent Application for the invention titled an Automated Slide Loader Cassette for Microscope, having Ser. No. 10/002,545 filed on Oct. 26, 2001.

Accordingly, while a few embodiments of the present invention have been shown and described, it is to be understood that many changes and modifications may be made thereunto without described from the spirit and scope of the invention as defined in the appended claims.

What is claimed is:

1. A vertically stacked control unit comprising
    an expandable plurality of intermediate functional modules, with each module having a front side, a back side, a top side, a bottom side, a right side, and a left side;
    said top side of said module having a first skirt receptacle on the right side and having a second skirt receptacle on the left side;
    said bottom side of said module having a first skirt on the right side and having a second skirt on the left side;
    said front side of each module having a top edge and a bottom edge; said back side of each module having a top edge and a bottom edge; said front side top edge having a first U-shaped receiver on the right side and having a second U-shaped receiver on the left side; said front side bottom edge having a first pin on the right side and having a second pin on the left side;
    said back side top edge having a first groove on the right side and having a second groove on the left side;
    said back side bottom edge having a first tongue on the right side and having a second tongue on the left side; and
    whereby a plurality of functional modules can be vertically stacked together with a first skirt and a second skirt of an upper module engaging a first and a second skirt receptacle respectively of a vertically adjoining lower module; with said first tongue and said second tongue of said upper module engaging said first groove and said second groove respectively of said vertically adjoining lower module; and with said first pin and said second pin on said upper module fitted respectively within said first U-shaped receiver and said second U-shaped receiver of said vertically adjoining lower module.

2. The vertically stacked control unit of claim 1, wherein the first U-shaped receiver on the right side is adjacent to the first skirt receptacle on the right side.

3. The vertically stacked control unit of claim 1, wherein the second U-shaped receiver on the left side is adjacent to the second skirt receptacle on the left side.

4. The vertically stacked control unit of claim 1, wherein the first pin on the right side is attached to the first skirt on the right side.

5. The vertically stacked control unit of claim 1, wherein the second pin on the left side is attached to the second skirt on the left side.

6. The vertically stacked control unit of claim 4, wherein the first pin on the right side is attached to an extension of the first skirt on the right side.

7. The vertically stacked control unit of claim 5, wherein the second pin on the left side is attached to an extension of the second skirt on the left side.

8. The vertically stacked control unit of claim 1, wherein the back side top edge first groove on the right side is adjacent to the first skirt receptacle on the right side.

9. The vertically stacked control unit of claim 1, wherein the back side top edge second groove on the left side is adjacent to the second skirt receptacle on the left side.

10. The vertically stacked control unit of claim 8, further comprising
    a first inwardly directed shoulder on the right side connecting said first groove on the right side to said first skirt receptacle on the right side.

11. The vertically stacked control unit of claim 9, further comprising
    a second inwardly directed shoulder on the left side connecting said second groove on the left side to said second skirt receptacle on the left side.

12. The vertically stacked control unit of claim 1, wherein the back side bottom edge first tongue on the right side is adjacent to the first skirt on the right side.

13. The vertically stacked control unit of claim 1, wherein the back side bottom edge second tongue on the left side is adjacent to the second skirt on the left side.

14. The vertically stacked control unit of claim 1, further comprising a top module of the control unit only having on a front side a bottom edge, and not a top edge on the front side; said front side bottom edge having a first pin on a right side and having a second pin on a left side;

said top module of the control unit only having on the back side a bottom edge, and not a top edge on the back side; said back side bottom edge having a first tongue on a right side and having a second tongue on a left side.

15. The vertically stacked control unit of claim 14, further comprising a bottom module of the control unit only having on a front side a top edge, and not a bottom edge on the front side; said front side top edge having a first U-shaped receiver on a right side and having a second U-shaped receiver on a left side;

said bottom module of the control unit only having on a back side a top edge, and not a bottom edge on the back side; said back side top edge having a first groove on a right side and having a second groove on a left side.

16. A vertically stacked control unit comprising a top module of the control unit only having on a front side a bottom edge, and not a top edge on the front side; said front side bottom edge having a first pin on a right side and having a second pin on a left side;

said top module of the control unit only having on the back side a bottom edge, and not a top edge on the back side; said back side bottom edge having a first tongue on a right side and having a second tongue on a left side; said first tongue adjacent to a first skirt on the right side; and said second tongue adjacent to a second skirt on the left side;

a bottom module of the control unit only having on a front side a top edge, and not a bottom edge on the front side; said front side top edge having a first U-shaped receiver on a right side and having a second U-shaped receiver on a left side;

said bottom module of the control unit only having on a back side a top edge, and not a bottom edge on the back side; said back side top edge having a first groove on a right side and having a second groove on a left side; and said bottom module having a first skirt receptacle on the right side and having a second skirt receptacle on the left side; and whereby the top and bottom functional modules can be vertically stacked together with a first skirt and a second skirt of the top engaging a first and a second skirt receptacle respectively of a vertically adjoining bottom module; with said first tongue and said second tongue of said top module engaging said first groove and said second groove respectively of said vertically adjoining bottom module; and with said first pin and said second pin on said top module fitted respectively within said first U-shaped receiver and said second U-shaped receiver of said vertically adjoining bottom module.

17. The vertically stacked control unit of claim 16, further comprising at least one intermediate module connected between said top module and said bottom module.

* * * * *